United States Patent
Chen

(10) Patent No.: US 6,562,643 B2
(45) Date of Patent: May 13, 2003

(54) PACKAGING TYPES OF LIGHT-EMITTING DIODE

(75) Inventor: Hsing Chen, Hsin Chu (TW)

(73) Assignee: Solidlite Corporation, Shin Chu (TW)

( * ) Notice: Subject to any disclaimer, the term of this patent is extended or adjusted under 35 U.S.C. 154(b) by 84 days.

(21) Appl. No.: 09/965,841

(22) Filed: Oct. 1, 2001

(65) Prior Publication Data

US 2002/0042156 A1 Apr. 11, 2002

(30) Foreign Application Priority Data

Oct. 6, 2000 (TW) ........................................ 89121073 A

(51) Int. Cl.[7] ............................................... H01L 21/00
(52) U.S. Cl. .................... 438/26; 438/106; 438/107; 438/110; 438/113; 438/124; 438/126; 438/127; 174/260; 174/262; 174/263; 361/719; 361/761; 361/764; 361/765; 361/820
(58) Field of Search .................... 438/26, 106, 107, 438/110, 113, 124, 126, 127; 174/260, 262, 263; 361/719, 761, 764, 765, 820

(56) References Cited

U.S. PATENT DOCUMENTS 5,724,232 A * 3/1998 Bhatt et al. .................. 361/762

* cited by examiner

Primary Examiner—David L. Talbott
Assistant Examiner—David A. Zarneke
(74) Attorney, Agent, or Firm—Rosenberg, Klein & Lee

(57) ABSTRACT

A LED packaging process is to place LED chips at predetermined positions on the printed circuit board substrate, followed by drilling holes to penetrate the substrate, followed by passing the printed circuit board through the solder furnace to completely fill the through-hole position with solder points, followed by using molds to make the soldering points into a groove reflector, followed by placing LED chips in the groove reflector, followed by wire bonding and using encapsulation resin for packaging to form SMD LED with reflectors. In the present invention, the filling with metal conductor in electrode through holes on the printed circuit board to form the groove reflector can enhance the heat dissipation of LED and the brightness of LED, which has the advantageous effects that traditional SMD LED can not have.

4 Claims, 5 Drawing Sheets

PACKAGING TYPES OF LIGHT-EMITTING DIODE

BACKGROUND OF THE INVENTION

1. Field of the Invention

The packaging of light-emitting diode (LED) basically has two types. One is LAMP type, which uses liquid resin for encapsulation. The present invention mainly uses the packaging process for SMD LED and also includes the new packaging technology of LED Chip on Board (COB).

2. Description of the Prior Art

The consideration of heat dissipation in LED package is very important, especially in the newest lighting application of white light LED, which no longer uses 15 mA or 20 mA as standard, but above 50 mA, even up to 100 mA (more brightness). Therefore, its power consumption is large, and heat generated is large as well. Hence, the heat dissipation ability should be enhanced. Hewlett Packard has developed a type of LED (called Super Flux LEDs by HP in model number HPWA-MHOO etc.) with special packaging structure (commonly called Perona fish), designed for good heat dissipation and can withstand up to 70 MA current (20 MA for traditional package). At present, LED of this type is mostly used in the third braking lights of automobiles.

In terms of heat dissipation in LED package, current surface mount device (SMD) is one of the worst, even worse than Lamp LED. Large current can not be sustained. The main reason for this is that effective heat conductance can not be achieved due to the poor heat dissipation of packaging resin and substrate itself.

Besides, traditional SMD LED mostly does not have reflective bases. There are few companies to include reflective base design in their products. The existing SMD LED with a reflective base mostly has recess on the printed circuit boards (substrates). The metal reflective layers are applied by plating, followed by die bonding, wire bonding and encapsulation before finished SMD LED products are made, as described in a Taiwan Patent with Publication No.381313. Because the bottom inside the concave cup reflecting base made on printed circuit board through drilling holes is in curved shape (cause by drilling holes), the connection for die bonding of LED chips is poor and unstable. Normal concave cup bottom should be flat to facilitate die bonding. Therefore, the technology has the above shortcoming and poor heat conductance.

SUMMARY OF THE INVENTION

For the first embodiment of the LED package in the present invention, it is first to directly drill holes (not digging holes) at the positions that need placement of LED chips, followed by through-hole plating (a general printed circuit board process), followed by passing printed circuit board through solder furnace to completely fill all through-hole plated holes with high-temperature solder, followed by pressing solder points with molds to form a groove, which is for die bonding of LED chips and reflection, followed by gold or silver plating on groove surface to form highly reflective metal films, finally followed by die bonding, wire bonding and encapsulation.

The greatest feature of the present invention is to use printed circuit board (PCB) process technology to fill up the through-hole position with high-temperature solder (above 250° C.), followed by bonding a groove reflector at that position with the use of the solder point for heat conductance and connection with heat dissipating material at bottom. Therefore, the present technology can directly use LED Chip On Board to make LED for traffic signal lights that have better performance than traditional products of Lamp type, lower process and material cost and superior heat dissipating ability. The technology can also be used for other LED lighting product development.

The main purpose of using high-temperature solder furnace (above 250° C.) in the first embodiment is to prevent the appearance of the high temperature up to 120° C. caused by heat generated from LED chips subject to long-term high current (above 30 mA). If common types of solder (183° C., Sn63%, Pb37%) is used, solder softening or solder crystal growth or low-temperature alloy will appear.

To avoid these things from happening and causing quality problems with LED reliability, the present invention specially emphasizes the use of high-temperature solder at about 250° C.–500° C., most preferably 350° C. Of course, most soldering material is composed of Sn/Pb alloys. If the groove surface is plated with highly reflective materials like Ag or Au, the performance of groove reflector will be affected because Sn easily forms alloys with Au and Ag. Therefore, in the present invention an isolating layer of Cr or other layers that are not easy to form low-temperature alloys with solder material is plated prior to plating gold or silver film. Thus, the adverse effect can be avoided when the SMD LED connected with other printed circuit board in the present technology passes through the solder furnace and are subject to high temperature.

The inventor has been dedicated to LED research for many years, obtaining several patents and making excellent achievement. In view of the problem with poor heat dissipation associated with SMD LED and LED Chip On Board, the inventor has spent tremendous efforts in finding the solution and new manufacturing process that mass production is feasible and has good competitive strength and production value.

BRIEF DESCRIPTION OF THE DRAWINGS

The drawings disclose an illustrative embodiment of the present invention that serves to exemplify the various advantages and objects hereof, and are as follows.

DESCRIPTION OF COMPONENTS IN FIGURES

Figure 1:
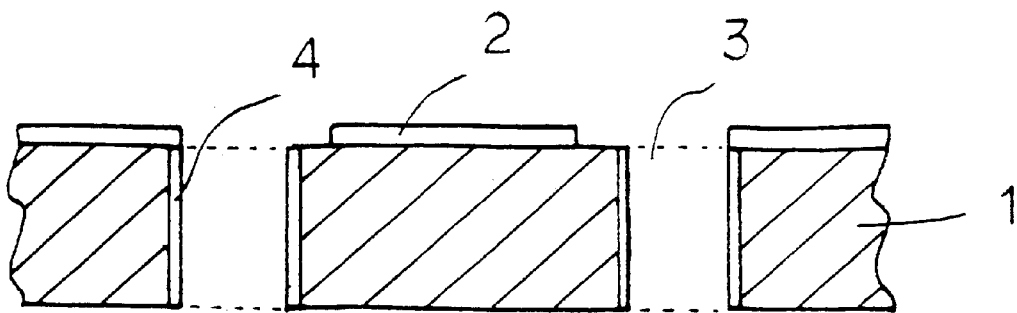
FIG. 1: the illustrative diagram that the printed circuit board has plated through holes for a first embodiment of the LED package in the present invention.

1: printed circuit board substrate
2: metal electrode
3: through hole
4: through-hole plated layer
5: soldering point
6: groove
7: LED chip
8: encapsulation resin
9: heat-dissipating material
10: electrode of metal bump
11: electrode base of metal bump

DETAILED DESCRIPTION OF THE PREFETTED EMBODIMENT

Figure 2:
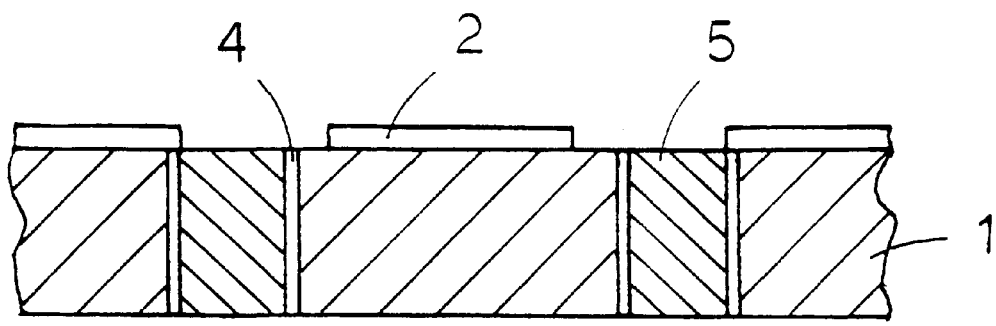
FIG. 2: the structural diagram that the holes on printed circuit board are completely filled with solder for the first embodiment of the LED package in the present invention.
Figure 3:
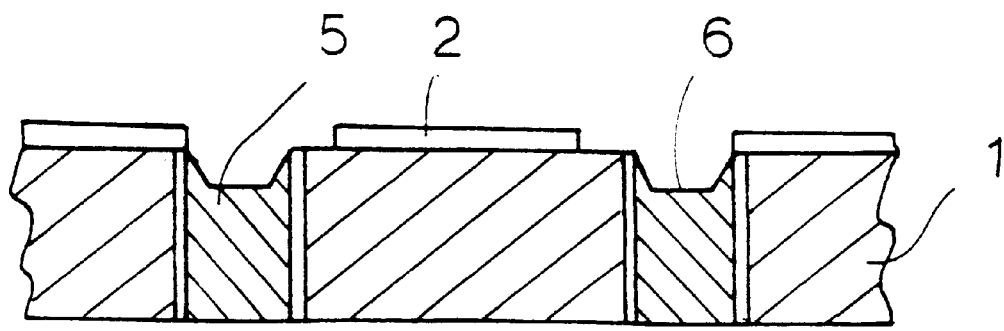
FIG. 3: the structural diagram that grooves are formed on solder points at through holes on printed circuit board for the first embodiment of the LED package in the present invention.
Figure 4:
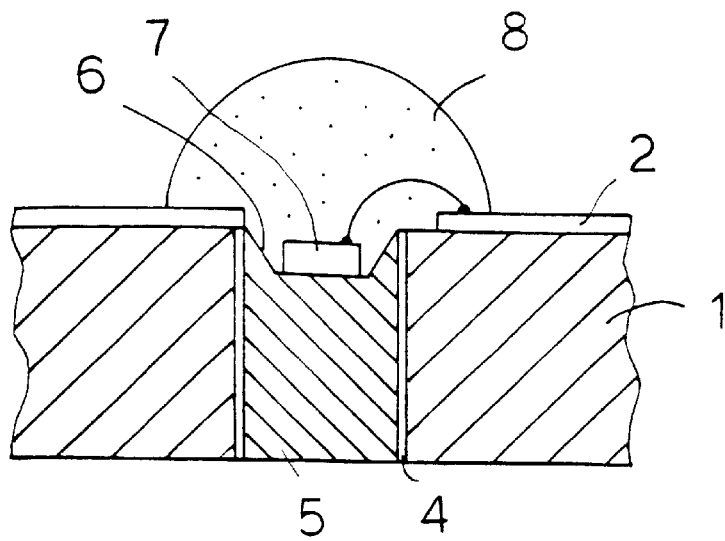
FIG. 4: the structural diagram that shows LED is produced on the grooves of solder points and a heat-dissipating material is applied to the back of the LED package for the first embodiment in the present invention.
Figure 5:
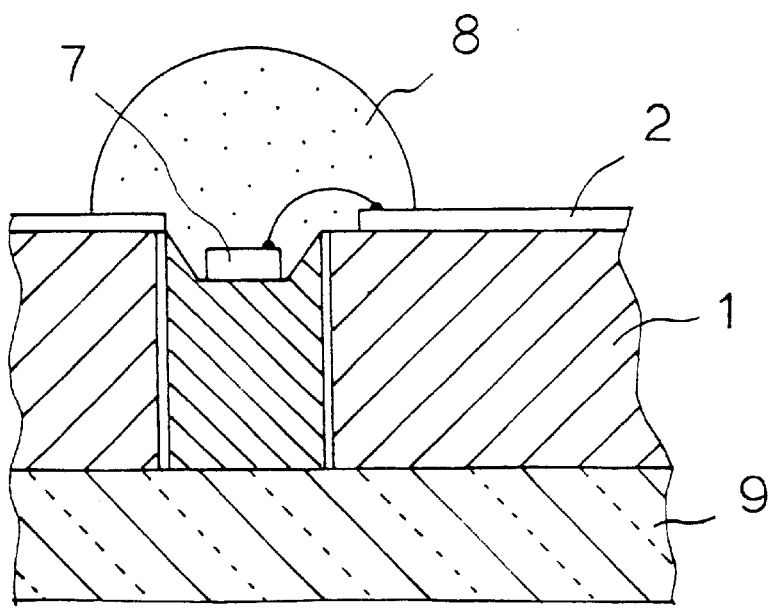
FIG. 5: the structural diagram that shows the printed circuit board is soldered with packaged LED and a heat-dissipating material is applied on back of the LED package for the first embodiment in the present invention.

The First Embodiment:

Please refer to FIG. 1, which illustrates the printed circuit board for the LED package in the present invention, wherein the packaging process includes producing electrode 2 on the surface of the printed circuit board substrate 1; forming through holes 3 by drilling at predetermined positions of the printed circuit board that LED chips are placed; plating the through holes on the printed circuit board to form through-hole plated metal layer 4; passing the printed circuit board through solder furnace to fill all through holes with solder to form soldering point 5 (as shown in FIG. 2); on the surface of soldering point 5, using molds to form a small groove that is plated on surface a metal layer or material (for example, Cr) that does not form low-temperature alloys with solder; plating a reflective layer of material like gold or silver; bonding LED chips to groove 6 and bonding wire; final filling with encapsulation resin 8 (as shown in FIG. 4) to form the finished product of LED COB. Since the position for LED placement is a metal soldering point on through hole printed circuit board, the heat generated by LED can be directly transported to the other end and a heat-dissipating material 9 can be applied on the other end (as shown in FIG. 5) to enhance heat dissipating ability. Therefore, the use of the present technology allows good heat dissipation and large current (50 mA~100 mA) passage. Traditional method can only allow the passage of current in about 25 mA due to poor heat dissipation. Hence, there is a great difference between LED COB packaging technology of the first embodiment in the present invention and the traditional method that directly bonds LED chips to general printed circuit boards.

Figure 6:
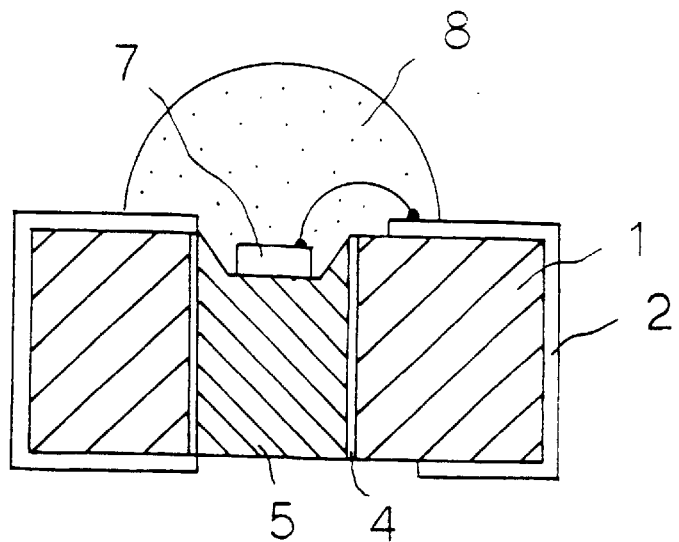
FIG. 6: the structural diagram 1 of SMD for the first embodiment of the LED package in the present invention.
Figure 7:
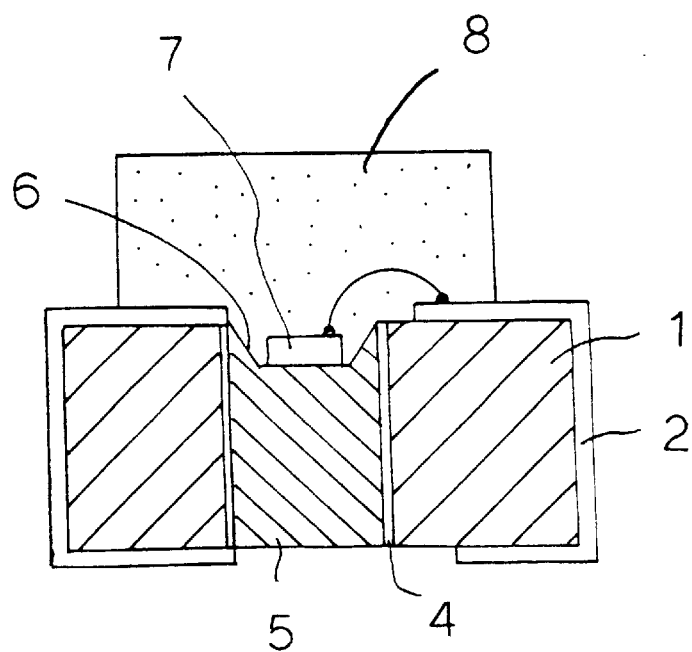
FIG. 7: the structural diagram 2 of SMD for the first embodiment of the LED package in the present invention.

In the first embodiment, another type of LED package is SMD LED, as shown in FIG. 6 and FIG. 7, which process is the same as previously described with the only difference in that electrode 2 connects laterally to the bottom and the packaged LED on printed circuit board are cut into SMD LED, which have good heat dissipating ability.

Figure 8:
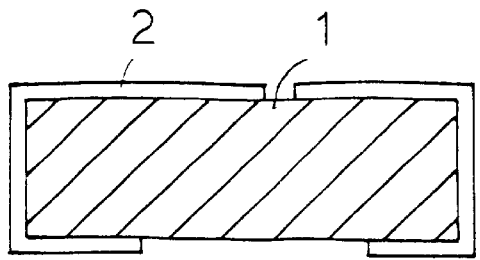
FIG. 8: the structural diagram of printed circuit board for a second embodiment of the LED package in the present invention.
Figure 9:
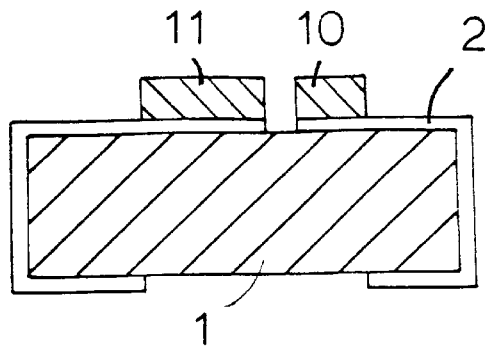
FIG. 9: the structural diagram that bumps are formed on the printed circuit board for the second embodiment of the LED package in the present invention.
Figure 10:
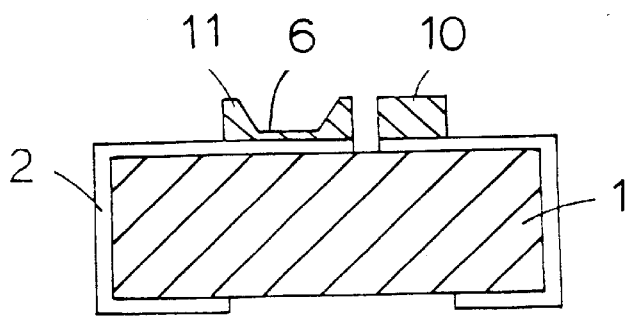
FIG. 10: the structural diagram that grooves are formed on the electrode base of metal bump for the second embodiment of the LED package in the present invention.
Figure 11:
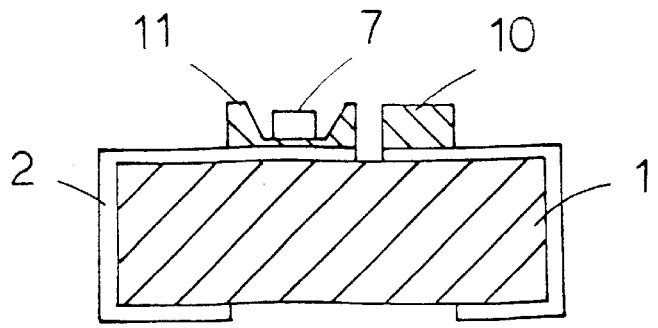
FIG. 11: the structural diagram that emitting chips are placed in the grooves for the second embodiment of the LED package in the present invention.
Figure 12:
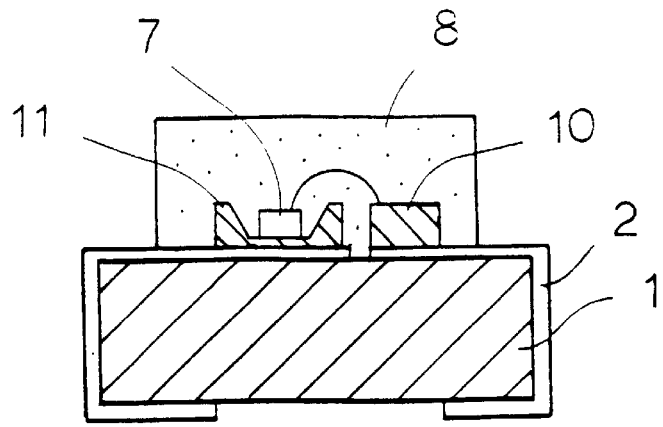
FIG. 12: the structural diagram 1 that shows SMD LED is formed for the second embodiment of the LED package in the present invention.
Figure 13:
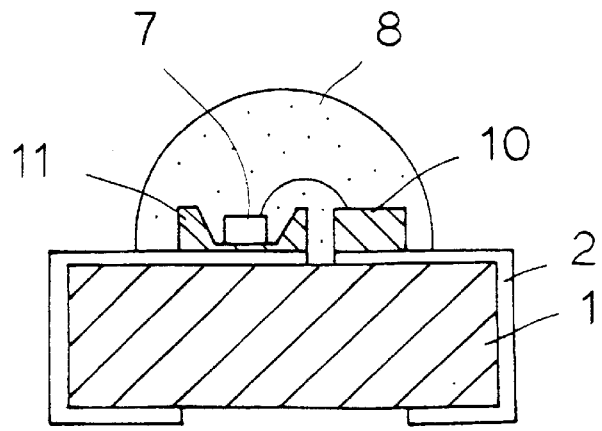
FIG. 13: the structural diagram 2 that shows SMD LED is formed for the second embodiment of the LED package in the present invention.

The Second Embodiment:

Please refer to FIG. 8, which illustrates the printed circuit board substrate 1 of the second embodiment for the LED package in the present invention (the same as the substrate in the first embodiment), wherein the packaging process includes forming the positive and the negative electrode surfaces at electrode 2 on the substrate surface; directing the electrode to the bottom; forming a metal bump by plating a metal layer of mainly copper material on the electrode surface with placement of LED chips and wire bonding in advance; forming a smaller bump called electrode of metal bump 10 on a larger bump called electrode base of metal bump 11; using molds to make the bump to form a small groove 6 that has the same function as the small groove 6 in the first embodiment, both being used to place LED chips for die bonding and light reflection; plating highly reflective material like gold or silver on electrode base of metal bump 11 containing groove 6 and electrode of metal bump 10 to enhance light reflecting function; final placing emitting chip 7 in groove 6 (as shown in FIG. 11) and bonding wire to connect electrodes to the other electrode of metal bump 10, followed by packaging into SMD LED with encapsulation resin 8 (as shown in FIG. 12 and FIG. 13).

In addition to plating, metal bumps can be formed by a printing method, i.e. a layer of metal gel (containing metal micro-particles) is coated on the desired electrode surface by screen printing, followed by heating for metal gel to sinter into an electrode of metal bump, followed by using molds to make the bump into groove. The heating temperature for metal material in screen printing can not be too high for annealing and sintering. Sn/Pb alloy, copper or silver can be used for such consideration.

Figure 14:
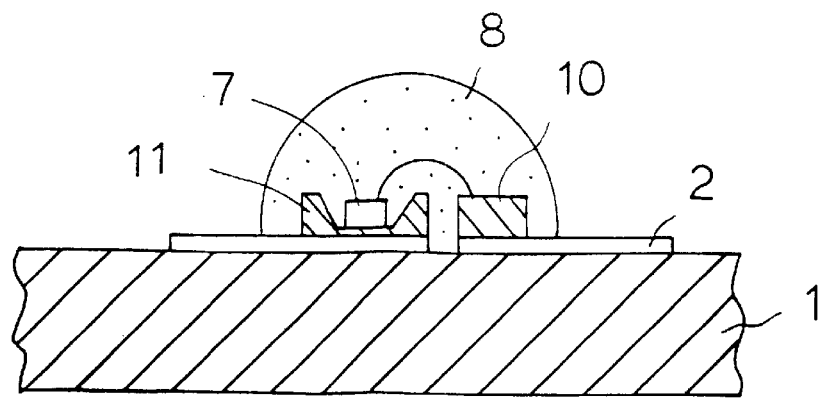
FIG. 14: the structural diagram 1 that COB is formed for the second embodiment of the LED package in the present invention.

For the second embodiment, electrode with reflector can be directly made at any predetermined position on printed circuit board and does not need to be cut into SMD, as shown in FIG. 14, i.e. forming LED by COB (Chip On Board) technology.

Both the two embodiments given in the present invention of "packaging of LED" can carry out LED COB packaging process directly on printed circuit board or can be directly cut into SMD. The first embodiment uses through-hole metal soldering point to form groove reflector, while the second embodiment uses bump metal point to form groove reflector. Both the two embodiments in the present invention are different from the traditional process for SMD LED, showing substantial innovation and progressiveness. Especially, the packaging of white light LED becomes increasingly important. In the approved patent of the inventor, the packaging of white light LED must use the groove design (please refer to new type patent U.S. Pat. No. 5,962,971). In view of the lighting application of white light LED in the future that large driving current is necessary and the present situation that SMD LED package can not allow for the passage of large current, the present invention is made.

Many changes and modifications in the above-described embodiment of the invention can, of course, be carried out without departing from the scope thereof.

Accordingly, to promote the progress in science and the useful arts, the invention is disclosed and is intended to by limited only by the scope of the appended claims.

What is claimed is:

1. A LED packaging process, wherein the predetermined positions on printed circuit board for placing LED chips are subject to drilling and through-hole plating, followed by treating the printed circuit board with solder furnace to form soldering points through completely filling the through holes with solder, followed by using molds to make the soldering points into a groove, followed by plating a metal reflecting layer on groove surface, followed by fixing LED chips to grooves and connecting electrode wires, followed by using encapsulation resin to form LED COB that has LED chips placed in substrates (LED COB), or followed by cutting the LED COB substrate into SMD LED with light-reflecting groove.

2. The LED packaging of claim 1, wherein the solder point is a high-temperature solder with melting point above 250° C.

3. The packaging for the LED of claim 1, wherein an isolating layer is first plated on the groove surface before a gold reflective layer is plated to prevent the metal material of the reflective layer from forming low-temperature alloy with the material of soldering point, wherein the isolating material can be Cr, Ni and Ti etc.

4. The packaging for the LED of claim 1, wherein a reflective layer is plated on the groove surface, wherein the material of the reflective layer is gold or silver.

* * * * *